United States Patent [19]
Nilsson

[11] Patent Number: 4,788,381
[45] Date of Patent: Nov. 29, 1988

[54] DEVICE FOR SEALING BETWEEN TWO METAL PLATES USED AS ELECTROMAGNETIC FIELD SCREENS

[75] Inventor: Uno S. Nilsson, Saltsjö-boo, Sweden

[73] Assignee: Telefonaktiebolaget L M Ericsson, Stockholm, Sweden

[21] Appl. No.: 49,998

[22] PCT Filed: Aug. 12, 1986

[86] PCT No.: PCT/SE86/00362

§ 371 Date: Apr. 22, 1987

§ 102(e) Date: Apr. 22, 1987

[87] PCT Pub. No.: WO87/01901

PCT Pub. Date: Mar. 26, 1987

[30] Foreign Application Priority Data

Sep. 13, 1985 [SE] Sweden ............................ 8504257

[51] Int. Cl.$^4$ .................................................. H05K 9/00
[52] U.S. Cl. ................................... 174/35 GC; 267/167
[58] Field of Search ..................... 174/35 GC, 35 R; 219/10.55 D; 267/167

[56] References Cited

U.S. PATENT DOCUMENTS

| | | | |
|---|---|---|---|
| 3,011,775 | 12/1961 | MacLeod | 267/167 |
| 3,502,784 | 3/1970 | Kunkel | 174/35 GC |
| 3,505,463 | 4/1970 | McAdams | 174/35 |
| 4,322,572 | 3/1982 | Snyder | 174/35 R |

FOREIGN PATENT DOCUMENTS

| | | | |
|---|---|---|---|
| 941548 | 4/1956 | Fed. Rep. of Germany | 174/35 GC |
| 1010680 | 11/1965 | United Kingdom | . |
| 1489047 | 10/1977 | United Kingdom | . |

Primary Examiner—Arthur T. Grimley
Assistant Examiner—David A. Tone
Attorney, Agent, or Firm—Burns, Doane, Swecker & Mathis

[57] ABSTRACT

A device is provided for achieving a seal between the edge portions of two metal plates which are used as screens against electromagnetic fields, the device including a metallic sealing strip which is intended to be compressed along these edge portions. The sealing strip (1) comprises a helically wound metal element with a cornered cross section, and the edge portion of one metal plate (6) is intended, by engaging against a support (4), to be pressed against the sealing strip (1) both in the cross-sectional and in the longitudinal direction of the strip, so that the turns of the helically wound metal element are twisted in the longitudinal direction of the strip in relation to their original positions. Parts of the cornered sides of the metal element will thus be pressed against said edge portions, which gives good metallic contact.

3 Claims, 1 Drawing Sheet

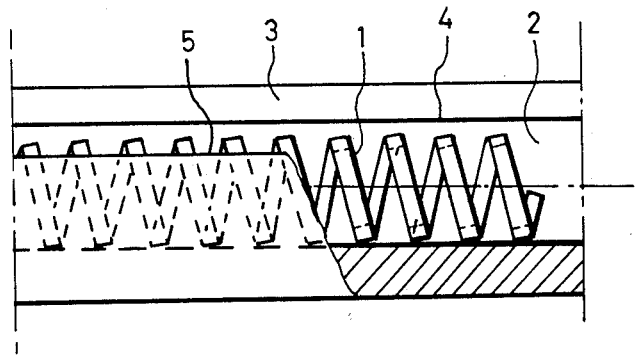 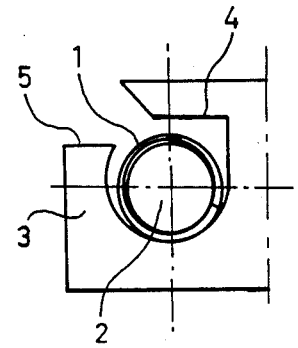
Fig. 1  Fig. 2
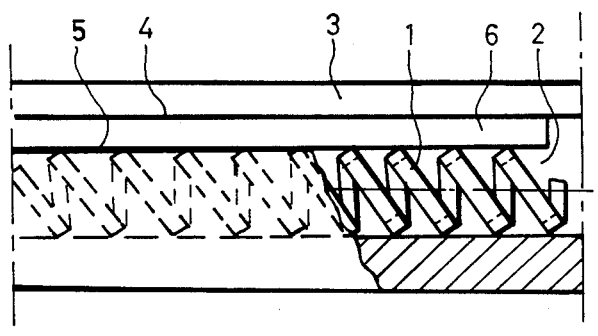 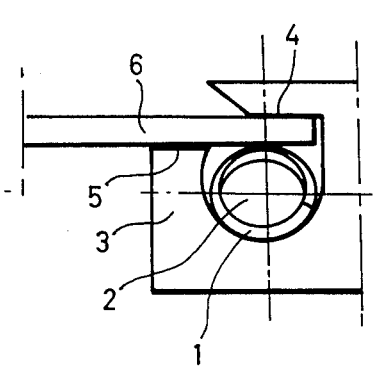
Fig. 3  Fig. 4

DEVICE FOR SEALING BETWEEN TWO METAL PLATES USED AS ELECTROMAGNETIC FIELD SCREENS

FIELD OF THE INVENTION

The invention relates to a device for sealing between the edge portions of two metal plates used as screens against electromagnetic fields, including a metallic sealing strip intended to be compressed along the edge portions.

BACKGROUND OF THE INVENTION

Electronic equipment associated, for example, with modern telephony and data transmission installations, is often fitted into metallic apparatus cabinets which screen off electromagnetic fields. For this screening to be effective, metallic sealing strips must generally be applied between the edge portions of the cabinet sides and adjacent to possible doors. Sealing strips are also required at the edges of cable compartment hatches in the floor in front of, and between different apparatus cabinets.

Sealing strips in the prior art are comprised of such as a metallic net, which is placed round an elastic, elongate core, or an elongate metal strip with a plurality of projecting, resilient tongues. A disadvantage with these sealing strips is that their sealing action decreases with time, due to the metal plates oxidising, which give deteriorated metallic contact. The known sealing strips are also relatively expensive, resulting in large costs for the total length of sealing strip required in a modern telephone exchange, for example.

OBJECTS AND SUMMARY OF THE INVENTION

An object of the present invention is to provide a device for sealing between the edge portions of metal plates according to the above, the sealing action of the device being maintained for a considerably longer time than for previously available sealing devices, and which is furthermore cheap to manufacture. This is achieved by the device including a sealing strip, which is a helically wound metal element of sharp-cornered cross section. If this sealing strip is compressed in a suitable way between the edge portions of the metal plates, parts of the sharp-cornered sides of the element will be pressed against these edge portions so that good metallic contact is obtained.

The distinguishing features of the invention are disclosed in the claims.

BRIEF DESCRIPTION OF THE DRAWING

The invention will now be described in detail with reference to the accompanying drawing, wherein FIG. 1 is a side view, partially in section, of an apparatus constructed in accordance with the invention prior to a sealing strip being compressed;

FIG. 2 is an end view of the apparatus of FIG. 1;

FIG. 3 is a side view corresponding to the view of FIG. 1, after the compression of a sealing strip; and FIG. 4 is an end view of the apparatus of FIG. 3.

DETAILED DESCRIPTION OF A PREFERRED EMBODIMENT

In FIGS. 1 and 2 there is illustrated in side view, and end view from the right in FIG. 1, an embodiment of a device implemented in accordance with the invention. The device includes a sealing strip 1, which is accomodated in a through-like groove 2 in the edge portion of one of two metal plates between which sealing is required. The sealing strip 1 is not shown in a compressed state and comprises a metal element wound into a helical shape. The metal element has a sharp-cornered cross section with a thickness of about 1 mm, and is manufactured from a material such as stainless steel. This cross section is preferably quadratic, but may have some other shape with edges, e.g. it may be hexagonal or rectangular. In a practical embodiment, the diameter of the helical strip is about 7 mm.

The through-like groove 2 is in a metal section 3, made from such as aluminium, and constitutes an edge portion of one of the two metal plates between which sealing is required. For example, the metal plates may comprise the lower part of one of the sides in an apparatus cabinet and a hatch to a cable compartment in the floor on one of the sides of the cabinet. Substantially the lower half (in the Figure) of the groove 2 is defined by a semicircular surface and its upper right-hand portion by the two flat surfaces forming a right angle, while its upper left-hand side portion is open. Of these surfaces, the one flat surface facing downwards towards the groove is denoted by the numeral 4. The metal section 3 also has a flat surface 5 outside the groove and directed upwards in the Figure.

A sealing device corresponding to the one in FIGS. 1 and 2 is illustrated in FIGS. 3 and 4, but after the sealing strip 1 has been compressed by the edge portion of a metal plate thrust into the groove 2. This plate is denoted by the numeral 6, and in the illustrated position engages against the flat surfaces 4 and 5 as well against the sealing strip. The plate 6 can thus constitute the above-mentioned hatch to a cable compartment, and the metal section 3 may be the edge portion of the lower part of one side in an apparatus cabinet. The thickness of the plate 6 exceeds the original distance between the sealing strip 1 and surface 4 by about 1 mm in a practical embodiment. The surface 4 will thus function as support for the plate 6 after the latter has been inserted into the groove 2.

If the plate 6 is displaced in the longitudinal direction of the sealing strip 1 simultaneously as it is thrust into the groove 2, the turns of the helically wound metal element will be twisted from the original positions, this movement taking place in the longitudinal direction of the strip, and about the bottommost contact points of the turns with the groove. The metal element then assumes the position illustrated in FIG. 3, for example. Parts of the sharp-cornered sides of the metal element will thus be pressed against the bottom of the groove 2 and the underside of the plate 6. As a result of this, there is good metallic contact between the edge portions of both metal plates, and thereby effective screening against electromagetic fields. The metalic contact ought not to be notably affected by an oxide layer occuring in time on the metal plates, since the fairly sharp corners of the metal element will be able to cut through such a layer.

The illustrated sealing device is furthermore considerably cheaper to manufacture than the previously available devices that can be used in a similar connection.

While this invention has been illustrated and described in accordance with a preferred embodiment, it is recognized that variations and changes may be made and equivalents employed herein without departing from the invention as set forth in the claims.

What is claimed is:

1. A connection arrangement for use in providing a seal between edge portions of two metal plates used as screens against electromagnetic fields comprising:
   a connection section having an edge and a groove extending along the edge, the groove having an axially extending curved surface and an axially extending substantially flat surface opposing the curved surface; and
   a helically wound metallic sealing strip positioned in the groove and having cornered edges, the sealing strip and the flat surface defining therebetween a receiving space adapted to receive a metal plate to be connected with the connection section, the sealing strip being resilient in the axial direction of the helical winding and in the radial direction thereof to present a cornered edge of the sealing strip to the receiving space upon the insertion of a metal plate into the space.

2. The connection arrangement as claimed in claim 1, wherein the connection section includes a contact surface disposed in a plane which is parallel to the substantially flat surface and which opposes the substantially flat surface, the contact surface being provided to contact the surface of a metal plate received in the receiving space.

3. The connection arrangement as claimed in claim 1, wherein the cross sectional area of the sealing strip is quadratic.

* * * * *